(12) United States Patent
Tsai et al.

(10) Patent No.: US 7,291,918 B2
(45) Date of Patent: Nov. 6, 2007

(54) LAYOUT STRUCTURE OF ELECTROSTATIC DISCHARGE PROTECTION CIRCUIT

(75) Inventors: Ming Lin Tsai, Shindian (TW); Chih-Long Ho, Shindian (TW)

(73) Assignee: VIA Technologies, Inc., Taipei (TW)

( * ) Notice: Subject to any disclaimer, the term of this patent is extended or adjusted under 35 U.S.C. 154(b) by 0 days.

(21) Appl. No.: 11/364,178

(22) Filed: Mar. 1, 2006

(65) Prior Publication Data
US 2007/0102765 A1    May 10, 2007

(30) Foreign Application Priority Data
Nov. 4, 2005    (TW)    .............................. 94138896 A

(51) Int. Cl.
*H01L 23/48* (2006.01)
(52) U.S. Cl. ...................... 257/758; 257/355; 257/360
(58) Field of Classification Search ................ 257/532, 257/173, 355, 360, 758; 357/51; 438/381
See application file for complete search history.

(56) References Cited

U.S. PATENT DOCUMENTS 6,489,689 B2 * 12/2002 Nojiri ......................... 257/786
6,956,747 B1 * 10/2005 Shigyo et al. .............. 361/793

\* cited by examiner

*Primary Examiner*—Douglas M. Menz
(74) *Attorney, Agent, or Firm*—Birch, Stewart, Kolasch & Birch, LLP

(57) ABSTRACT

A layout structure of electrostatic discharge (ESD) protection circuit cooperated with an ESD protection device includes a first electrically conductive layer and a second electrically conductive layer. The first electrically conductive layer is disposed on the ESD protection device and electrically connected to the ESD protection device. The second electrically conductive layer is disposed on the first electrically conductive layer and electrically connected to the first electrically conductive layer. A width or a projection area of the second electrically conductive layer is less than that of the first electrically conductive layer.

21 Claims, 6 Drawing Sheets

LAYOUT STRUCTURE OF ELECTROSTATIC DISCHARGE PROTECTION CIRCUIT

BACKGROUND OF THE INVENTION

1. Field of Invention

The present invention relates to a layout structure, and more particularly to a layout structure of electrostatic discharge (ESD) protection circuit.

2. Related Art

In order to prevent a signal terminal of an electronic system from being impacted by electrostatic discharge, an ESD protection circuit is coupled to the terminal of the system in the prior art.

As shown in FIG. 1, a conventional ESD protection circuit 1 is electrically connected between an input pad 21 and an core circuit 22. The input pad 21 receives an external signal and transmits the external signal to the core circuit 22. The core circuit 22 performs the special functions with respect to the different signals from the input pad 21 as the designer proposed. The ESD protection circuit 1 includes two diodes 11 and 12 respectively electrically connected to power terminal $V_{DD}$ and power terminal $V_{SS}$. Similarly, the conventional ESD protection circuit 1 is also used in other pads, such as the output pad, the power pad and etc.

As shown in FIG. 2, a wiring architecture on the diode 11 is of an interdigitated layout, and the cross-sectional structures of lines A-A' and B-B' in FIG. 2 are shown in FIG. 3. The diode 11 is disposed on a substrate 16, and the wiring architecture on the diodes 11 and 12 sequentially includes electrically conductive layers 15, 14 and 13. The electrically conductive layer 13 is electrically connected to the input pad 21 and the power terminal $V_{DD}$. The electrically conductive layer 13 on the diode 12 is electrically connected to the input pad 21 and the power terminal $V_{SS}$. In addition, the diodes 11 and 12 of the ESD protection circuit 1 may also be replaced by transistors in the prior art. For example, the diode 11 may be replaced by a P-type metal oxide semiconductor (PMOS), and the diode 12 may be replaced by an N-type metal oxide semiconductor (NMOS).

When a discharge current is inputted to the input pad 21 from a signal wire, the diodes 11 and 12 are turned on by the discharge current. The discharge current does not flow into the core circuit 22, and the core circuit 22 is free from being impacted by the discharge current.

Although the core circuit 22 is free from being impacted by the discharge current according to the ESD protection circuit 1, the wire layout of the ESD protection circuit 1 produces the huge stray capacitances due to the coupling of the wires. The stray capacitances are induced between two of the metallic layers 13 to 15, and between the substrate 16 and any one of the metallic layers 13 to 15. When the input pad 21 is disposed on the metallic layer 13, the stray capacitance between the input pad 21 and the metallic layers 13 to 15 causes a larger equivalent stray capacitance coupling to the core circuit 22.

The larger equivalent stray capacitance is coupled to the core circuit 22, the driving loading of the core circuit 22 is larger. For example, when the core circuit 22 is a low noise amplifier of the radio frequency communication device, the stray capacitance is also an extra driving loading for the core circuit 22, thereby decreasing the efficiency of the core circuit 22.

It is therefore an important subject of the present invention to provide a layout structure of electrostatic discharge protection circuit capable of reducing the stray capacitance between wires, reducing the influence of the ESD protection circuit on the cooperated electronic system, and enhancing the efficiency of the cooperated electronic system.

SUMMARY OF THE INVENTION

According to one embodiment of the present invention, a layout structure of electrostatic discharge protection circuit according to the present invention is cooperated with an ESD protection device. The layout structure includes a first electrically conductive layer and a second electrically conductive layer. The first electrically conductive layer is disposed on the ESD protection device and electrically connected to the ESD protection device. The second electrically conductive layer is disposed on the first electrically conductive layer and electrically connected to the first electrically conductive layer. A width or a projection area of the second electrically conductive layer is less than that of the first electrically conductive layer.

According to one embodiment of the present invention, an electrostatic discharge protection circuit according to the present invention is cooperated with a pad. The ESD protection circuit includes an ESD protection device, a first electrically conductive layer and a second electrically conductive layer. The first electrically conductive layer is disposed on the ESD protection device and electrically connected to the ESD protection device. The second electrically conductive layer is disposed on the first electrically conductive layer and electrically connected to the first electrically conductive layer. A width or a projection area of the second electrically conductive layer is less than that of the first electrically conductive layer.

According to one embodiment of the present invention, an integrated circuit chip according to the present invention includes at least one pad, at least one core circuit and an electrostatic discharge protection circuit. The ESD protection circuit is coupled between the pad and the core circuit. The ESD protection circuit includes an ESD protection device, a first electrically conductive layer and a second electrically conductive layer. The first electrically conductive layer is disposed on the ESD protection device and electrically connected to the ESD protection device. The second electrically conductive layer is disposed on the first electrically conductive layer and electrically connected to the first electrically conductive layer and the pad. A width or a projection area of the second electrically conductive layer is less than that of the first electrically conductive layer.

As mentioned above, due to the width or the projection area of the second electrically conductive layer is less than that of the first electrically conductive layer, a layout structure of electrostatic discharge protection circuit according to the present invention can reduce the stray capacitance between the electrically conductive layers, minimize the influence of the ESD protection circuit on the cooperated electronic system, and enhance the efficiency of the cooperated electronic system.

BRIEF DESCRIPTION OF THE DRAWINGS

The present invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
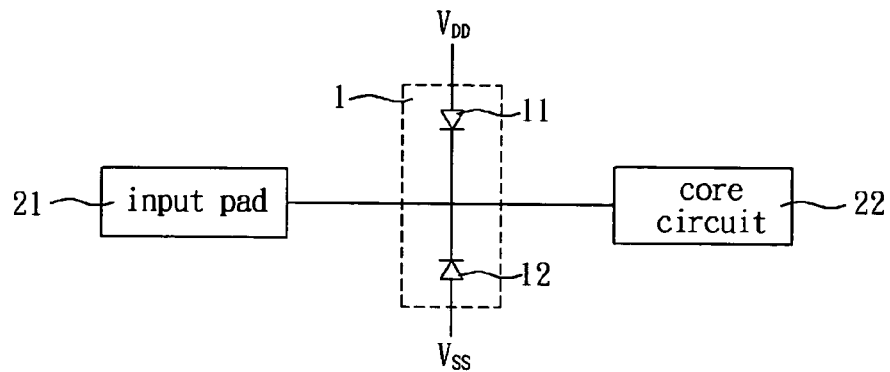
FIG. 1 is a block diagram showing a conventional ESD protection circuit.
Figure 2:
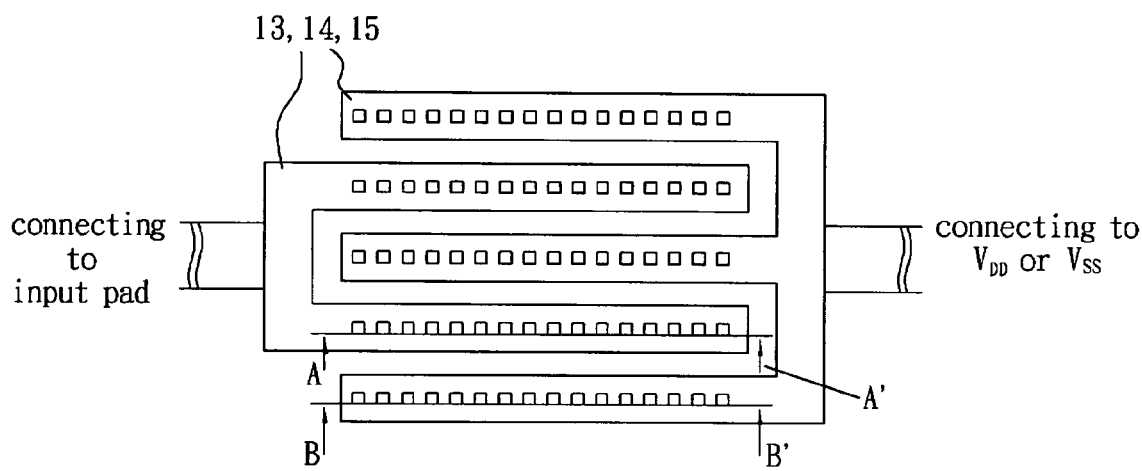
FIG. 2 is a schematic view showing the conventional ESD protection circuit.
Figure 3:
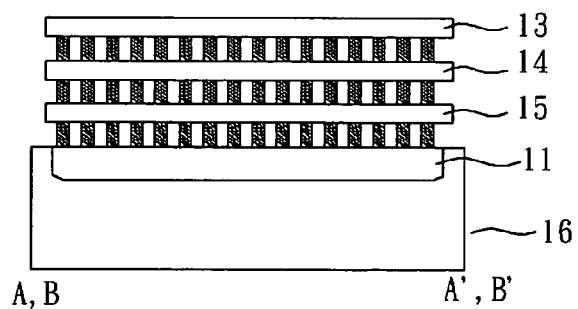
FIG. 3 is another schematic view showing the conventional ESD protection circuit.
Figure 4:
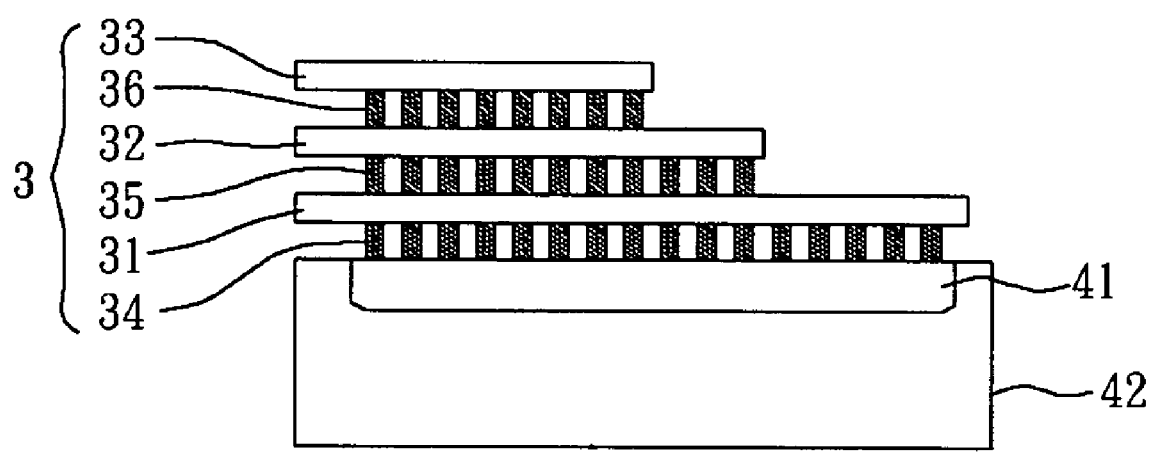
FIG. 4 is a schematic view showing a layout structure of electrostatic discharge protection circuit according to an embodiment of the present invention.

Referring to FIG. 4, a layout structure 3 of electrostatic discharge protection (ESD) circuit according to an embodiment of the present invention is cooperated with an ESD protection device 41. The ESD protection device 41, which may be a pn junction diode or a transistor for example, is disposed on a substrate 42 and the interconnection layers are further disposed on the ESD protection device 41. The layout structure 3 of the ESD protection circuit includes a plurality of electrically conductive layers 31, 32 and 33. The electrically conductive layer 31 is disposed on the ESD protection device 41 and electrically connected to the ESD protection device 41. The electrically conductive layers 32 and 33 are sequentially disposed on the electrically conductive layer 31. The electrically conductive layers 31, 32 and 33 are electrically connected to one another through the electrically conductive parts 34, 35 and 36. A width or a projection area of the electrically conductive layers 32 is less than that of the electrically conductive layer 31. Furthermore, a width or a projection area of the electrically conductive layer 33 is less than that of the electrically conductive layer 32.

In this embodiment, the ESD protection device 41 is disposed in a substrate 42. For easy to be understood, the electrically conductive layer 31 may be disposed on the interconnection layer Metal-1 (M1), which is the first interconnection layer formed on the ESD protection device 41. The electrically conductive layers 32 and 33 may be further disposed on the interconnection layer Metal-2 (M2), and the interconnection layer Metal-3 (M3) respectively. The ESD protection device 41 may include a diode or a transistor (e.g., PMOS or NMOS transistor). The ESD protection device 41 is electrically connected to the electrically conductive layer 31 through at least one electrically conductive part 34. The electrically conductive layers 31, 32 and 33 are electrically connected together through electrically conductive parts 35 and 36. The electrically conducive parts 34, 35 and 36 pass through the dielectric layer between the interconnection layers and act as the electrically connections between any two adjacent interconnection layers. The electrically conductive parts 34, 35 and 36 may be wires, vias or contacts.

The electrically conductive layers 31, 32 and 33 are made of metal or alloy. The layout structure 3 of electrostatic discharge protection circuit may be applied to semiconductor processes of forming a complementary metal oxide semiconductor (CMOS), a bipolar complementary metal oxide semiconductor (BiCMOS). On another hand, the layout structure 3 of electrostatic discharge protection circuit may be also applied to the gallium arsenide (GaAs) semiconductor technology or the silicon germanium (SiGe) semiconductor technology.

Figure 5:
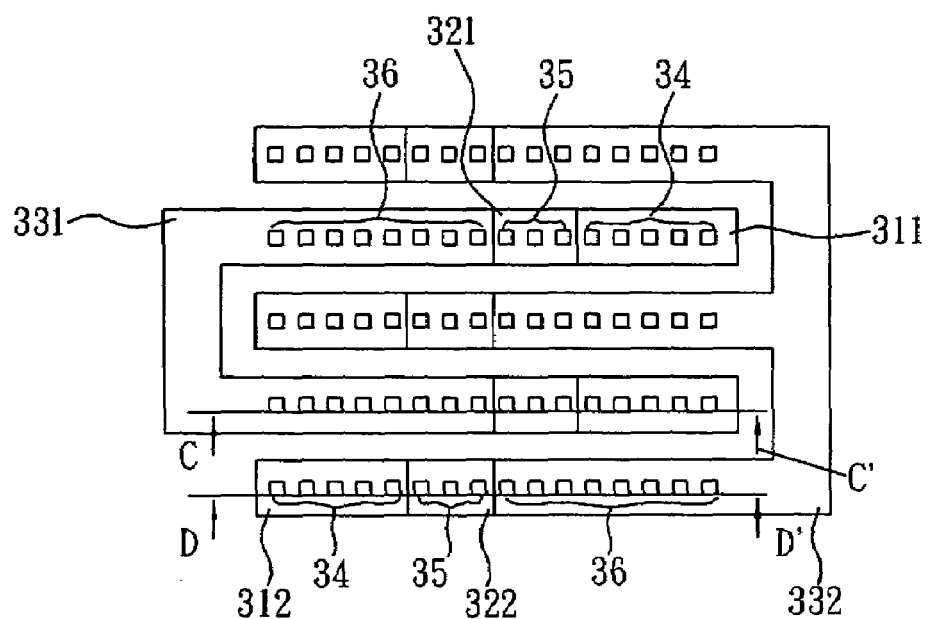
FIG. 5 is a schematic view showing a circuit disposed in an interdigitated manner in the layout structure of electrostatic discharge protection circuit according to the embodiment of the present invention.
Figure 5:
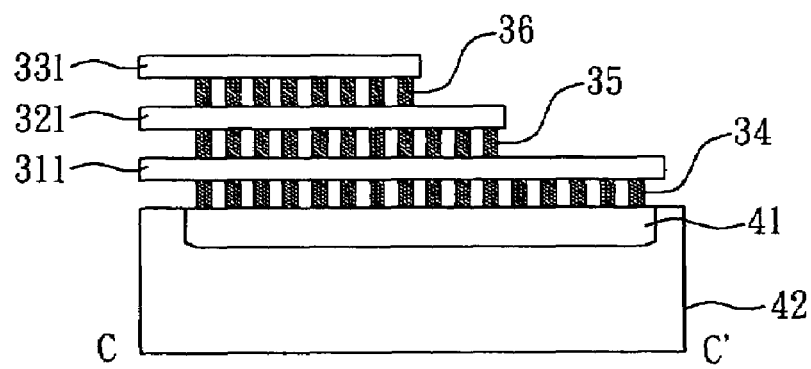
Figure 5:
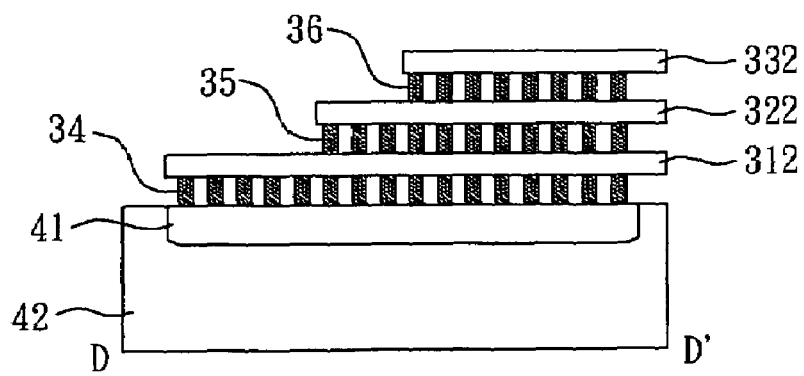
Figure 6:
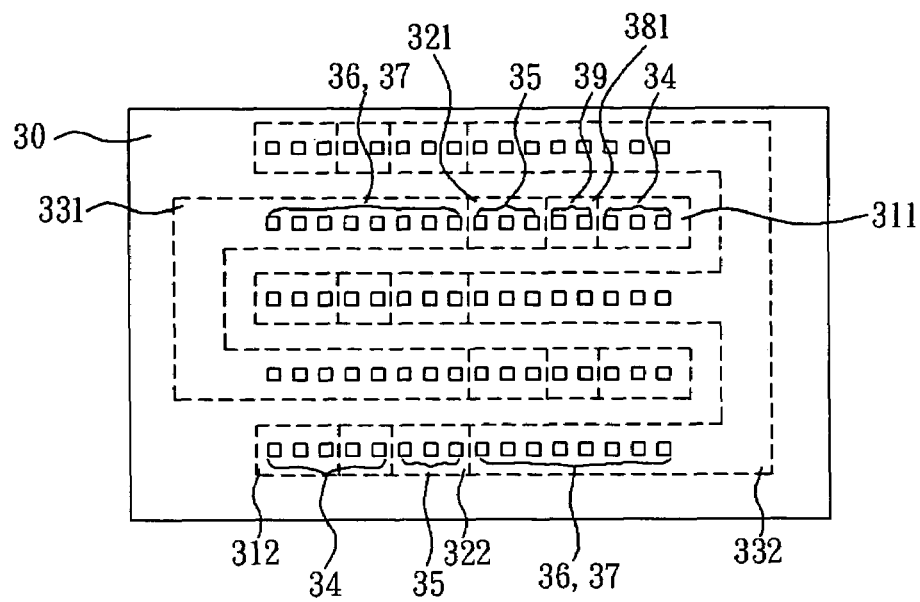
FIG. 6 is a schematic view showing the layout structure of electrostatic discharge protection circuit, which includes a pad, according to the embodiment of the present invention.
Figure 6:
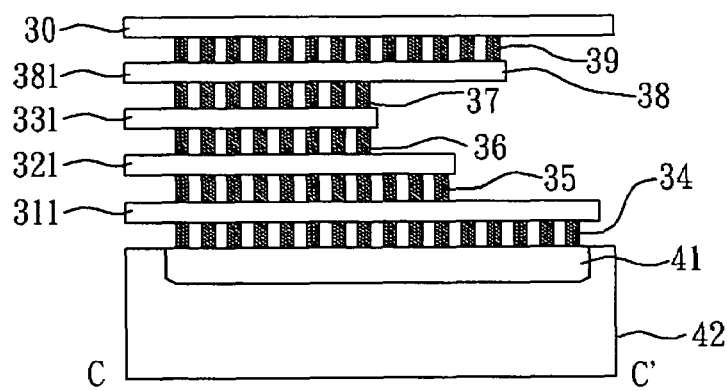
Figure 6:
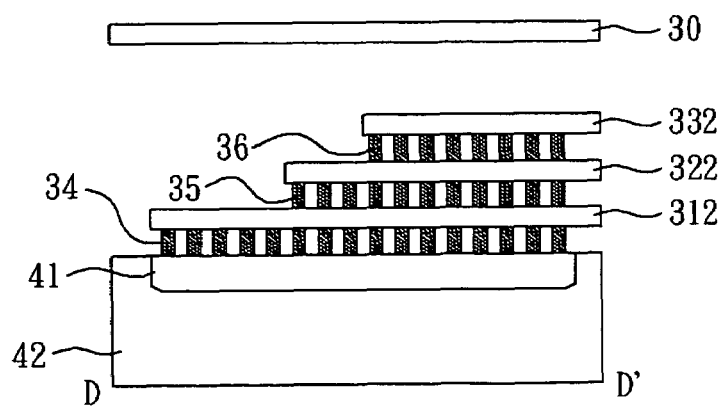
Figure 7:
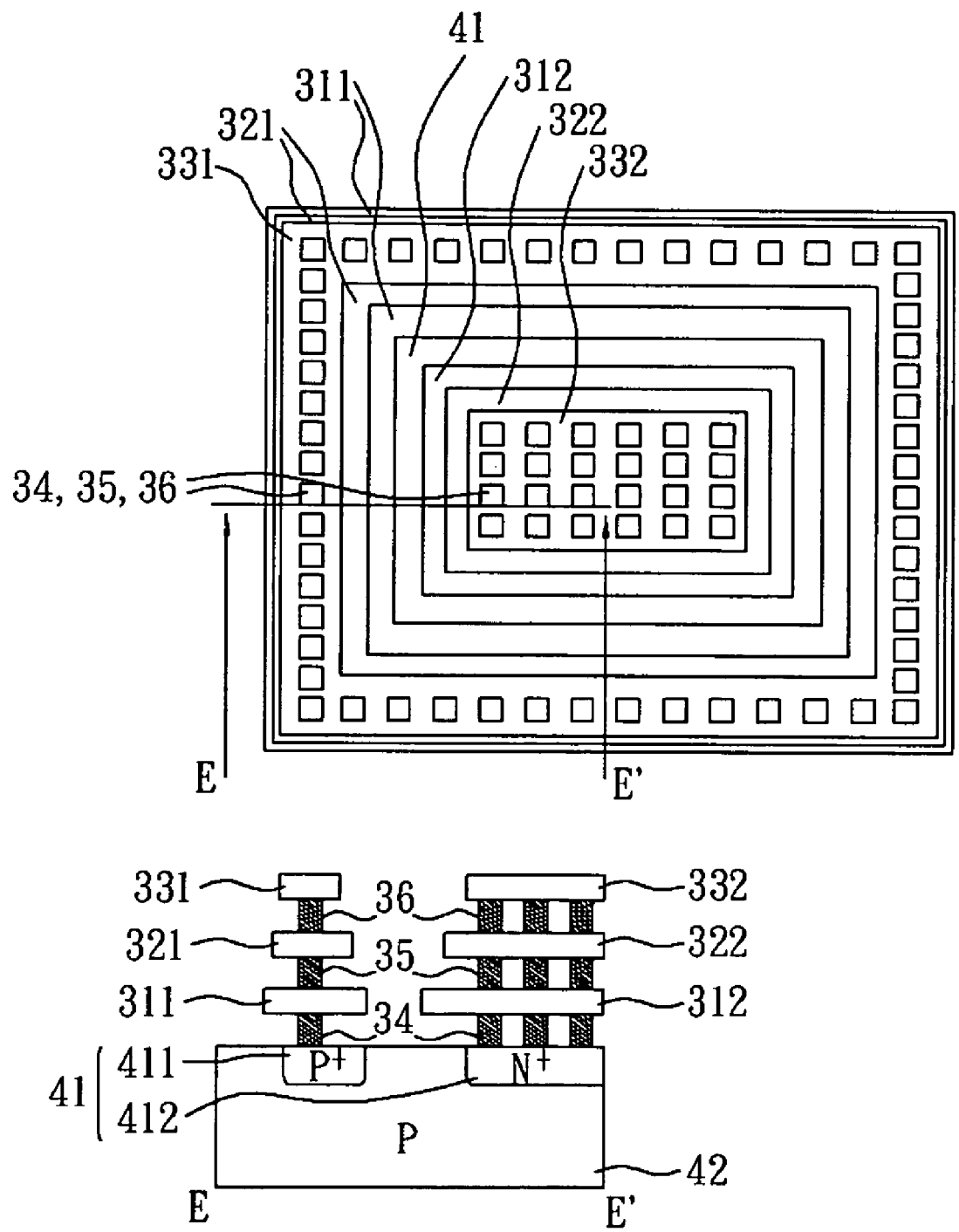
FIG. 7 is a schematic view showing a circuit disposed in a frame-interlacing manner in the layout structure of electrostatic discharge protection circuit according to the embodiment of the present invention.

Referring to FIGS. 5 to 7, the electrically conductive layer 31 includes pattern 311 and pattern 312, the electrically conductive layer 32 includes pattern 321 and pattern 322, and the electrically conductive layer 33 includes pattern 331 and pattern 332. The patterns 311, 321 and 331 are electrically connected to one another. The pattern 311 is electrically connected to one terminal of the ESD protection device 41. A width or a projection area of the pattern 321 is less than that of the pattern 311, and a width or a projection area of the pattern 331 is less than that of the pattern 311 or of the pattern 321. The patterns 312, 322 and 332 are electrically connected to one another. The pattern 312 is electrically connected to another terminal of the ESD protection device 41. A width or a projection area of the pattern 322 is less than that of the pattern 312, and a width or a projection area of the pattern 332 is less than that of the pattern 312 or of the pattern 322. Thus, the stray capacitance between two of the electrically conductive layers 31 to 33 can be reduced.

On the other hand, an interlaced area between the pattern 321 and pattern 322 is also smaller than an interlaced area between the pattern 311 and pattern 312. Thus, the stray capacitance of the electrically conductive layer 32 is smaller than that of the electrically conductive layer 31. Similarly, the stray capacitance of the electrically conductive layer 33 is smaller than that of the electrically conductive layer 32. The stray capacitance between different patterns in the same electrically conductive layer (such as pattern 331 and pattern 332 of the electrically conductive layer 33) is reduced, and the equivalent capacitance of the layout structure of electrostatic discharge protection circuit is thus further reduced.

As shown in FIG. 5, the patterns 311, 321 and 331 and the patterns 312, 322 and 332 are disposed in an interdigitated manner. The patterns 311 and 312 are electrically connected to two terminals of the ESD protection device 41. As shown in the cross-sectional views of lines C-C' and D-D', the electrically conductive parts 35 and 34 sequentially exist below the electrically conductive part 36.

Compared FIG. 6 to FIG. 5, the layout structure 3 of electrostatic discharge protection circuit further includes an electrically conductive layer 38 and a pad 30. The electrically conductive layer 38 is disposed on the electrically conductive layer 33. The electrically conductive layer 38 includes a pattern 381. The pattern 381 is electrically connected to the pattern 331 through at least one electrically conductive part 37. The pad 30 is disposed on the electrically conductive layer 38 and electrically connected to the patterns 381 of the electrically conductive layer 38 through at least one electrically conductive part 39. The pad 30 may be used as the signal transmitting or the power transmitting of the core circuit 45 (shown in FIG. 8). Comparing with the prior art, due to the width or projection area of the patterns 311 to 332, and 381 is smaller than that of the pad 30, respectively, the stray capacitance between the patterns 311 to 332, 381 and the pad 30 can be reduced. Besides, because the distance between the pad 30 and the pattern 332 is larger than that between the pattern 332 and the pattern 322, the stray capacitance between the pad 30 and the pattern 332 can be reduced.

Because the discharge current of the electrostatic discharge protection flows from the pad 30 to the substrate 42, the current density in the interconnection layers above the pad 30 and the ESD protection device 41 is the highest, and the interconnection layers tend to be damaged easily. Comparing with the prior art, the layout structure 3 of electrostatic discharge protection circuit can effectively disperse the electrostatic discharge current to each metallic layer, and thus prevent the interconnection layers from being damaged due to the too-high current density.

As shown in FIG. 7, the patterns 311, 321 and 331 and the patterns 312, 322 and 332 are disposed in a frame-interlacing manner in this embodiment. Thus, the stray capacitance between two of the electrically conductive layers 31 to 33 can be reduced. One of ordinary skill in the art can easily modify the layout structure of electrostatic discharge protection circuit without departing from the spirit and scope of the present invention. For example, the patterns 311, 321 and 331 and the patterns 312, 322 and 332 may also be disposed in a spiral interlacing manner. For another example, the ESD protection device 41 may be a pn junction diode which having a heavily positive doping region 411 and a heavily negative doping region 412 disposed on a substrate 42. Normally, the substrate 42 may be a silicon chip with light positive doping. The heavily positive doping region 411 may be connected to the pad 30 through the patterns 311, 321 and 331, and the electrically conductive parts 34, 35 and 36. The heavily negative doping region 412 may be connected to the power terminal $V_{DD}$ through the patterns 312, 322 and 332, and the electrically conductive parts 34, 35 and 36. Any modification in the ESD protection device 41 is without departing from the spirit and scope of the present invention.

Figure 8:
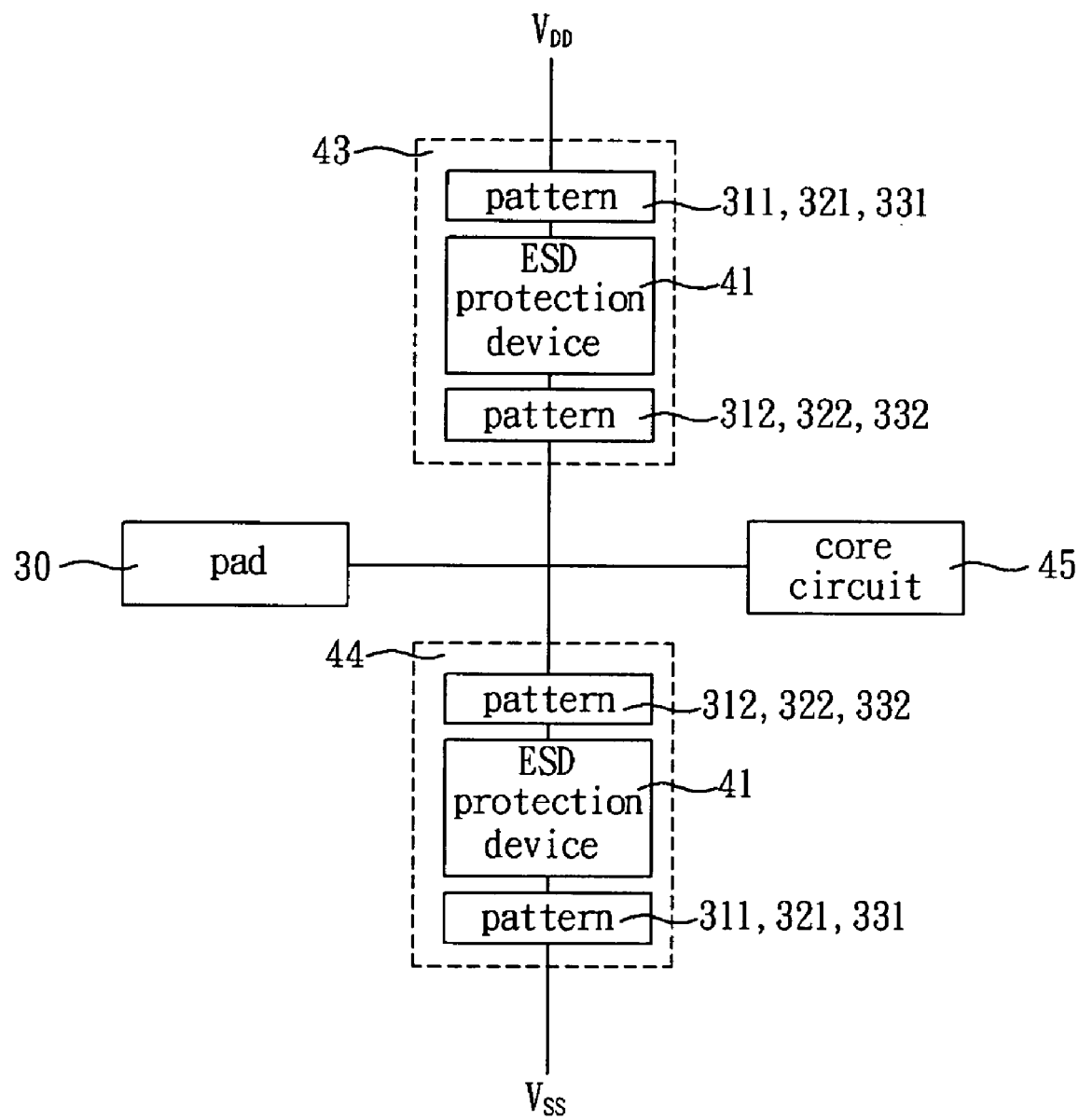
FIG. 8 is a block diagram showing an ESD protection circuit according to the embodiment of the present invention.

As shown in FIG. 8, the layout structure 3 of electrostatic discharge protection circuit, the pad 30, the ESD protection device 41 and the substrate 42 in this embodiment can be applied to an integrated circuit chip 4. The layout structure 3 and the ESD protection device 41 constitute two ESD protection circuits 43 and 44. In addition, the integrated circuit chip 4 further includes at least one core circuit 45, and the ESD protection circuits 43 and 44 are coupled between the pad 30 and the core circuit 45.

In the ESD protection circuit 43, the pattern 311 is electrically connected to one terminal of the ESD protection device 41, the pattern 312 is electrically connected to another terminal of the ESD protection device 41, the pattern 331 is electrically connected to the pattern 311 through the pattern 321, the pattern 332 is electrically connected to the pattern 312 through the pattern 322, the pattern 331 is electrically connected to the power terminal $V_{DD}$, and the pattern 332 is electrically connected to the pad 30. In the ESD protection circuit 44, what is different from the ESD protection circuit 43 is that the circuit 331 is electrically connected to the power terminal $V_{SS}$.

The width or the projection area of the pattern 311 is larger than that of the pattern 321. The width or the projection area of the pattern 312 is larger than that of the pattern 322. Thus, the stray capacitance between the different electrically conductive layers 31 and 32 can be reduced. Comparing with the prior art, when the pad 30 is disposed on the patterns 331 and 332, the stray capacitance between the pad 30 and the electrically conductive layer 33 can also be reduced. Thus, as the stray capacitance reduced, the driving loading produced in the ESD protection circuits 43 and 44 on the core circuit 45 can be reduced, and the efficiency of the core circuit 45 can be thus enhanced. The stray capacitance can be further reduced when the width or the projection area of the pattern 321 is larger than that of the pattern 331 or the width or the projection area of the pattern 322 is larger than that of the pattern 332.

In summary, due to the width or the projection area of the second electrically conductive layer is less than that of the first electrically conductive layer, a layout structure of electrostatic discharge protection circuit according to the present invention can reduce stray capacitance between the electrically conductive layers, minimize the influence of the ESD protection circuit on the cooperated electronic system, and enhance the efficiency of the cooperated electronic system.

Although the present invention has been described with reference to specific embodiments, this description is not meant to be construed in a pivoting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A layout structure coupled with an ESD protection device, the layout structure comprising:
    a first electrically conductive layer, which is disposed on the ESD protection device and electrically connected to the ESD protection device, wherein the first electrically conductive layer comprises:
        a first pattern electrically connected to a first terminal of the ESD protection device; and
        a second pattern electrically connected to a second terminal of the ESD protection device; and
    a second electrically conductive layer, which is disposed on the first electrically conductive layer and electrically connected to the first electrically conductive layer, and a width or a projection area of the second electrically conductive layer is less than that of the first electrically conductive layer, wherein the second electrically conductive layer comprises:
        a third pattern electrically connected to the first pattern, and a width or a projection area of the third pattern is less than that of the first pattern; and
        a fourth pattern electrically connected to the second pattern, and a width or a projection area of the fourth pattern is less than that of the second pattern.

2. The layout structure according to claim 1, wherein the first pattern and the second pattern are disposed in an interdigitated manner.

3. The layout structure according to claim 1 wherein the first pattern and the second pattern are disposed in a frame-interlacing manner.

4. The layout structure according to claim 1, further comprising:
    a third electrically conductive layer, which is disposed on the second electrically conductive layer and electrically connected to the second electrically conductive layer; and
    a pad, which is disposed on the third electrically conductive layer and electrically connected to the third electrically conductive layer.

5. The layout structure according to claim 4, wherein the third electrically conductive layer comprises:
    a fifth pattern electrically connected to the third pattern, and a width or a projection area of the fifth pattern is less than that of the third pattern; and a sixth pattern electrically connected to the fourth pattern, and a width or a projection area of the sixth pattern is less than that of the fourth pattern. PS.

6. An electrostatic discharge (ESD) protection circuit cooperated with a pad, the ESD protection circuit comprising:
    an ESD protection device;
    a first electrically conductive layer, which is disposed on the ESD protection device and electrically connected to the ESD protection device, wherein the first electrically conductive layer comprises:
        a first pattern electrically connected to a first terminal of the ESD protection device; and
        a second pattern electrically connected to a second terminal of the ESD protection device; and
    a second electrically conductive layer, which is disposed on the first electrically conductive layer and electrically connected to the first electrically conductive layer, wherein the second electrically conductive layer comprises:
        a third pattern electrically connected to the first pattern, and a width or a projection area of the third pattern is less than that of the first pattern; and
        a fourth pattern electrically connected to the second pattern, and a width or a projection area of the fourth pattern is less than that of the second pattern.

7. The ESD protection circuit according to claim 6, wherein the first pattern and the second pattern are disposed in an interdigitated manner.

8. The ESD protection circuit according to claim 6, wherein the first pattern and the second pattern are disposed in a frame-interlacing manner.

9. The ESD protection circuit according to claim 6, further comprising:
    a third electrically conductive layer, which is disposed on the second electrically conductive layer and electrically connected to the second electrically conductive layer, and the pad is disposed on the third electrically conductive layer and electrically connected to the third electrically conductive layer.

10. The ESD protection circuit according to claim 6, wherein the pad is disposed on the second electrically conductive layer, and the width or the projection area of the second electrically conductive layer is less than that of the pad.

11. The ESD protection circuit according to claim 9, wherein the third electrically conductive layer comprises:
    a fifth pattern electrically connected to the third pattern, and a width or a projection area of the fifth pattern is less than that of the third pattern; and
    a sixth pattern electrically connected to the fourth pattern, and a width or a projection area of the sixth pattern is less than that of the fourth pattern.

12. An integrated circuit chip, comprising:
    at least one pad;
    at least one core circuit; and
    an electrostatic discharge (ESD) protection circuit, which is coupled between the pad and the core circuit and comprises an ESD protection device, a first electrically conductive layer and a second electrically conductive layer, wherein the first electrically conductive layer is disposed on the ESD protection device and electrically connected to the ESD protection device, and the first electrically conductive layer comprises:
        a first pattern electrically connected to a first terminal of the ESD protection device; and
        a second pattern electrically connected to a second terminal of the ESD protection device; and
    the second electrically conductive layer is disposed on the first electrically conductive layer and electrically connected to the first electrically conductive layer and the pad, the second electrically conductive layer comprises:
        a third pattern electrically connected to the first pattern, and a width or a projection area of the third pattern is less than that of the first pattern; and
        a fourth pattern electrically connected to the second pattern, and a width or a projection area of the fourth pattern is less than that of the second pattern.

13. The integrated circuit chip according to claim 12, wherein the width or the projection area of the second electrically conductive layer is less than that of the pad.

14. The integrated circuit chip according to claim 12, wherein the first pattern and the second pattern are disposed in an interdigitated manner.

15. The integrated circuit chip according to claim 12, wherein the first pattern and the second pattern are disposed in a frame-interlacing manner.

16. The integrated circuit chip according to claim 12, further comprising:
    a third electrically conductive layer, which is disposed between the second electrically conductive layer and the pad, and electrically connected to the second electrically conductive layer and the pad.

17. The integrated circuit chip according to claim 16, wherein the third electrically conductive layer comprises:
    a fifth pattern electrically connected to the third pattern, and a width or a projection area of the fifth pattern is less than that of the third pattern; and
    a sixth pattern electrically connected to the fourth pattern, and a width or a projection area of the sixth pattern is less than that of the fourth pattern.

18. A layout structure coupled with an ESD protection device, the layout structure comprising:
    a first electrically conductive layer, which is disposed on the ESD protection device and electrically connected to the ESD protection device;
    a second electrically conductive layer, which is disposed on the first electrically conductive layer and electrically connected to the first electrically conductive layer, and a width or a projection area of the second electrically conductive layer is less than that of the first electrically conductive layer; and
    a third electrically conductive layer, which is disposed on the second electrically conductive layer and electrically connected to the second electrically conductive layer, and a width or a projection area of the third electrically conductive layer is less than that of the second electrically conductive layer.

19. The layout structure according to claim 18, wherein the first electrically conductive layer comprises:
    a first pattern electrically connected to a first terminal of the ESD protection device; and
    a second pattern electrically connected to a second terminal of the ESD protection device.

20. The layout structure according to claim 19, wherein the first pattern and the second pattern are disposed in an interdigitated manner.

21. The layout structure according to claim 19, wherein the first pattern and the second pattern are disposed in a frame-interlacing manner.

* * * * *